United States Patent
Tamura et al.

(10) Patent No.: US 9,013,889 B2
(45) Date of Patent: Apr. 21, 2015

(54) ELECTRONIC CONTROLLER

(75) Inventors: Masako Tamura, Chiyoda-ku (JP); Yasuhiro Takahashi, Chiyoda-ku (JP); Toru Kubo, Minato-ku (JP); Seiji Kato, Minato-ku (JP); Takaaki Tanaka, Chiyoda-ku (JP); Hideki Umemoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 274 days.

(21) Appl. No.: 13/460,086

(22) Filed: Apr. 30, 2012

(65) Prior Publication Data

US 2013/0120943 A1 May 16, 2013

(30) Foreign Application Priority Data

Nov. 10, 2011 (JP) ................. 2011-246365

(51) Int. Cl.
*H05K 5/00* (2006.01)
*H05K 5/06* (2006.01)

(52) U.S. Cl.
CPC .............. *H05K 5/069* (2013.01); *H05K 5/0052* (2013.01); *H05K 5/062* (2013.01)

(58) Field of Classification Search
USPC ................. 361/816, 818, 732, 752, 796, 800; 174/350, 377, 561–564
See application file for complete search history.

(56) References Cited

U.S. PATENT DOCUMENTS

| | | | | |
|---|---|---|---|---|
| 5,994,643 A | * | 11/1999 | Saito | 174/372 |
| 6,407,925 B1 | * | 6/2002 | Kobayashi et al. | 361/752 |
| 7,026,548 B2 | * | 4/2006 | Bolken et al. | 174/538 |
| 7,081,691 B2 | * | 7/2006 | Kawata | 307/9.1 |
| 7,144,275 B2 | * | 12/2006 | Iida | 439/587 |
| 7,563,992 B2 | * | 7/2009 | Lawlyes et al. | 174/561 |
| 8,727,794 B2 | * | 5/2014 | Tanaka et al. | 439/76.1 |

FOREIGN PATENT DOCUMENTS

| | | |
|---|---|---|
| JP | 09-292299 A | 11/1997 |
| JP | 2001-085866 A | 3/2001 |
| JP | 2001-298289 A | 10/2001 |
| JP | 2003-258454 A | 9/2003 |
| JP | 2009-077211 A | 4/2009 |
| JP | 2010-177507 A | 8/2010 |
| JP | 2013-4759 A | 1/2013 |

OTHER PUBLICATIONS

Preliminary Notice of Reasons for Rejection, dated Mar. 5, 2013, JPA No. 2011-246365.

* cited by examiner

*Primary Examiner* — Hung S Bui
(74) *Attorney, Agent, or Firm* — Sughrue Mion, PLLC

(57) ABSTRACT

Provided is an electronic controller which enables visual identification of a portion applied with a small amount of a sealing material, which has a high possibility of air leakage from an area in which a joint is to be established. The electronic controller includes: an electronic circuit board; and a casing including a cover (1), a base (4), and a lid sealed with a sealing material (20) applied to surfaces thereof at which the cover (1), the base (4), and the lid are to be joined together. An area in which the cover (1), the base (4), and the lid are to be joined together is provided with a space (16) thereto for enabling an application state of the sealing material (20) to be observed with a naked eye.

10 Claims, 6 Drawing Sheets

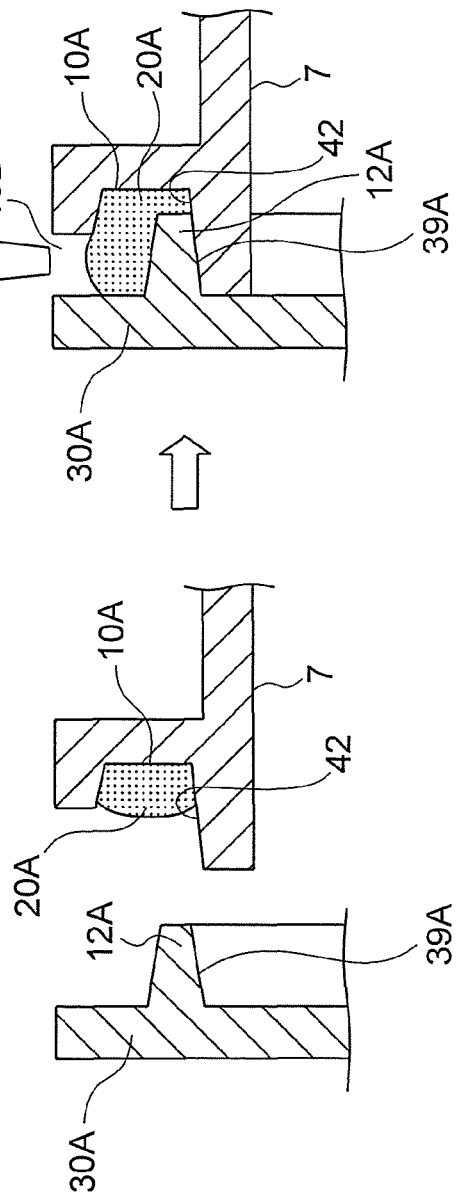

ELECTRONIC CONTROLLER

BACKGROUND OF THE INVENTION

1. Field of the Invention

The present invention relates to an electronic controller which includes electronic components mounted on an electronic circuit board housed within a casing.

2. Description of the Related Art

An electronic controller, which is used for controlling a vehicle or the like, includes an electronic circuit board, a plurality of electronic components, and a casing. On the electronic circuit board, connectors for electrical connection to the exterior are provided. The plurality of electronic components are mounted on the electronic circuit board. The casing is made of a resin or a metal. The electronic circuit board is housed in the casing for protection of the electronic components.

Among various types of electronic controller, an electronic controller provided in an engine room or directly mounted on an engine has a water-proof structure in view of a possibility of getting wet with water. As an example of the electronic controller described above, there exists an electronic controller disclosed in Japanese Patent Application Laid-open No. 2003-258454 (FIGS. 4 and 5).

The electronic controller described in Japanese Patent Application cited above has the following structure. A casing including vertically separated members, that is, a base and a cover, is used to interpose an electronic circuit board on which a connector is provided. A gap between a peripheral wall end surface of the base and a flange portion of the cover is sealed with a water-proof sealing material.

A sealing structure at surfaces, at which the base and the connector, and the cover and the connector are to be respectively jointed together, is as follows. A groove is provided on the connector. A projecting portion is provided on the cover at a position corresponding to the groove, whereas another projecting portion is provided on the base. A water-proof sealing material is provided in the groove of the connector. In this manner, the gaps between the cover and the connector and between the base and the connector are sealed.

In the electronic controller having the water-proof structure as described in Japanese Patent Application Laid-open No. 2003-258454 cited above, it is necessary to check a water-proofing property thereof by an airtightness test so as to ensure the water-proofing property after the assembly of the electronic controller.

In a case of electronic controllers using an adhesive or a liquid packing as a sealing material, when an electronic controller which does not meet a predetermined standard because of a small application amount of the sealing material is found in the airtightness test for the casing of the electronic controller, it is necessary to additionally apply the sealing material from the exterior to an area of the casing, in which a joint is to be established, and to conduct the airtightness test again.

In the case of the electronic controller described above, however, the application amount of the sealing material on the area of the casing, in which a joint is to be established, cannot be easily checked. Therefore, it is difficult to identify a portion from which air leaks, specifically, a portion which requires to be additionally applied with the sealing material.

If, for example, complicated tasks such as immersing the electronic controller into a tank storing water therein and feeding air into the electronic controller to identify the air leakage portion are performed, the air leakage portion can be identified. However, conducting such tasks in a fabrication line for the electronic controllers is not practical in view of a line space, capital investment, and fabrication cost.

As described above, the conventional electronic controllers have had a problem in that it is difficult to identify a portion with a small amount of the sealing material, which has a high possibility of air leakage, and to additionally apply the sealing material only to the identified portion at the location of assembly.

As countermeasures against the aforementioned problem, it is possible to conceive of additionally applying the sealing material over the entire periphery from the exterior of the casing of the electronic controller. In this case, however, there arises another problem in that the amount of the sealing material to be used disadvantageously increases, thereby increasing the cost of the electronic controller.

SUMMARY OF THE INVENTION

The present invention has been made to solve the problems described above, and therefore, has an object to provide an electronic controller which enables visual identification of a portion applied with a small amount of a sealing material, which has a high possibility of air leakage from an area in which a joint is to be established, so as to reduce a reject ratio in an airtightness test and thus improve the efficiency of assembly operation by additionally applying the sealing material to the visually identified portion before the airtightness test is conducted.

Further, the present invention has another object to provide an electronic controller which enables the use of an appropriate amount of the sealing material and thus eliminates an unnecessary use of the sealing material by applying the sealing material only to the portion applied with the small amount of the sealing material when the sealing material is to be additionally applied.

An electronic controller according to the present invention includes: an electronic circuit board having electronic components mounted thereon; and a casing for housing the electronic circuit board therein, the casing including a plurality of casing members sealed with a sealing material applied to surfaces at which the plurality of casing members are to be joined together, in which an area in which the plurality of casing members are to be joined together is provided with a space thereto for enabling an application state of the sealing material to be observed with a naked eye from exterior in a state in which the plurality of casing members are joined together.

According to the electronic controller of the present invention, the space enabling the application state of the sealing material to be observed with the naked eye from the exterior, in a state in which the casing members are joined together, is provided to the area in which the casing members are to be joined together. Therefore, the portion applied with the small amount of the sealing material, which has the high possibility of air leakage from the area in which the casing members are to be joined together can be visually identified. As a result, by additionally applying the sealing material before the airtightness test is conducted, the reject ratio in the test can be reduced and the efficiency of assembly operation can be improved.

Further, by applying the sealing material only to the portion applied with the small amount of sealing material when the sealing material is to be additionally applied, the use of the appropriate amount of the sealing material can be attained, and thus the unnecessary use of the sealing material can be eliminated.

BRIEF DESCRIPTION OF THE DRAWINGS

In the accompanying drawings:

FIG. 6A is a sectional view of a principal part of a casing main body and a lid illustrated in FIG. 5 before the casing main body and the lid are joined together; and FIG. 6B is a sectional view of the principal part of the casing main body and the lid after the casing main body and the lid are joined together.

DETAILED DESCRIPTION OF THE PREFERRED EMBODIMENTS

Figure 1:
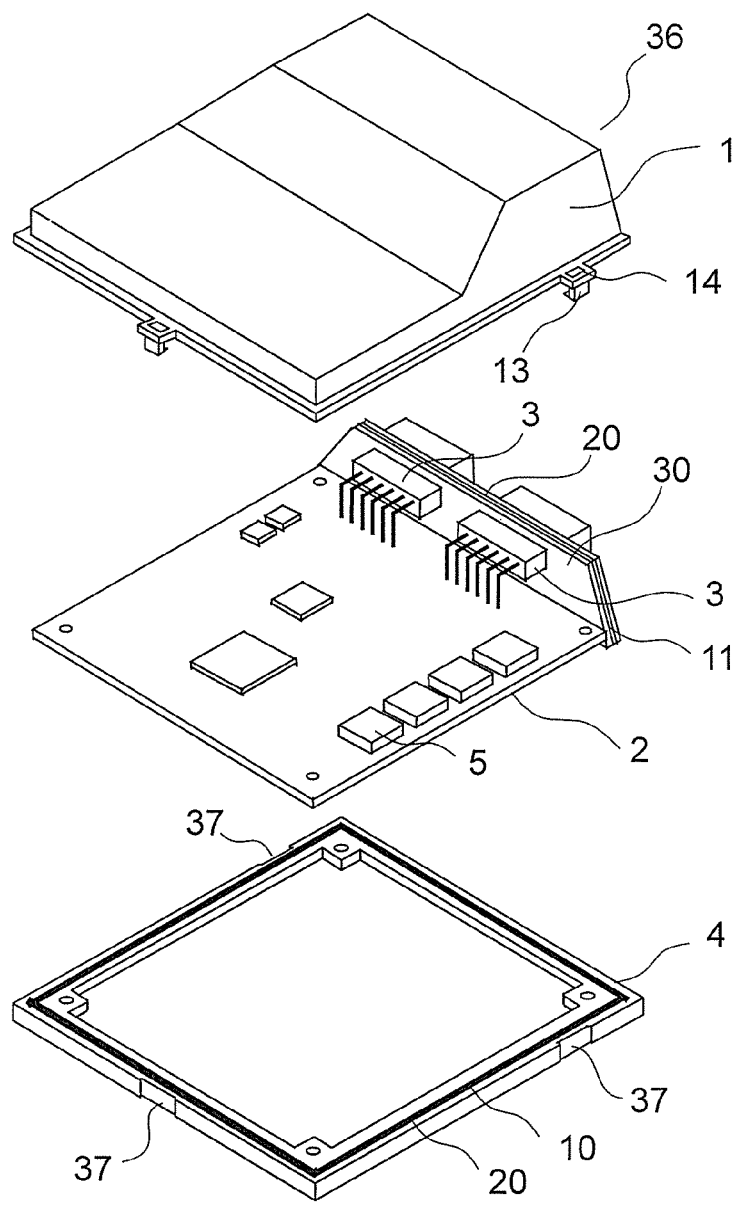
FIG. 1 is an exploded perspective view schematically illustrating a structure of an electronic controller according to Embodiment 1 of the present invention.

Hereinafter, an electronic controller according to embodiments of the present invention is described with reference to the drawings. In the drawings, the same or equivalent members or portions are denoted by the same reference numeral for description.

Embodiment 1

FIG. 1 is an exploded perspective view schematically illustrating a structure of an electronic controller according to Embodiment 1 of the present invention.

The electronic controller includes an electronic circuit board 2 having electronic components 5 mounted thereon, and a casing which houses the electronic circuit board 2 therein.

The casing includes a base 4, a cover 1, and a lid 30. The base 4 and the cover 1 interpose the electronic circuit board 2 from both sides to cover the electronic circuit board 2. The lid 30 supports connectors 3, each being electrically connected to the electronic circuit board 2, and closes an opening portion 36 formed by the base 4 and the cover 1.

Note that, the lid 30 and the connectors 3 may be formed as one component instead of being formed as separate members.

In this embodiment, casing members constituting the casing are the base 4, the cover 1, and the lid 30.

As a material of the cover 1, the base 4, and the lid 30, a metal having a high thermal conductivity, such as aluminum, is desirable in view of heat-radiation performance. However, when the heat-radiation performance is not needed, other materials may be used.

Three sides of the base 4 having a rectangular shape and three sides of the cover 1 are joined together by using a sealing material 20. A lower end of the lid 30 is joined to one side of the base 4 having the rectangular shape by using the sealing material 20. An upper end of the lid 30 is joined to an inner peripheral portion of the opening portion 36 of the cover 1 by using the sealing material 20. The opening portion 36 has a trapezoidal shape.

The sealing material 20 is applied to grooves 10 and 11. The groove 10 is formed along four sides of the base 4, whereas the groove 11 is formed along upper three end surfaces of the lid 30.

Figure 2A:
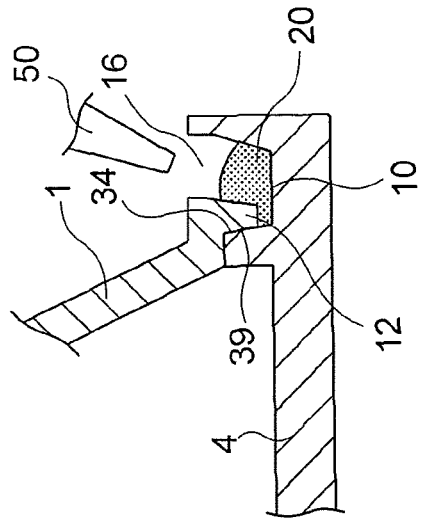
FIG. 2A is a sectional view of a principal part of a cover and a base illustrated in FIG. 1 before the cover and the base are joined together.
Figure 2B:
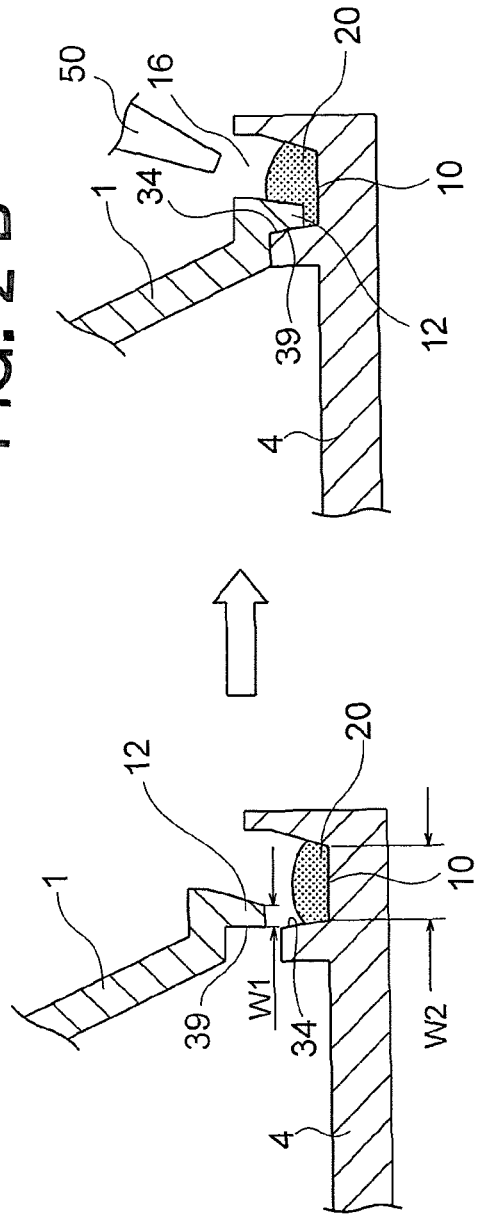
FIG. 2B is a sectional view of the principal part illustrated in FIG. 1 after the cover and the base are joined together.

FIG. 2A is a sectional view of a principal part of the cover 1 and the base 4 illustrated in FIG. 1 before the cover 1 and the base 4 are joined together, whereas FIG. 2B is a sectional view of the principal part of the cover 1 and the base 4 illustrated in FIG. 1 after the cover 1 and the base 4 are joined together.

A projection 12 is formed over the entirety of a lower end of the cover 1. The projection 12 is formed so as to be bent at a base thereof. A width W1 of the projection 12 is smaller than a width W2 of the groove 10.

When the cover 1 and the base 4 are to be joined together, an inner wall surface 39 of the projection 12 comes into surface contact with an inner wall surface 34 of the groove 10 of the base 4. Then, the projection 12 is lowered in this state. In this manner, the projection 12 presses and flattens the sealing material 20 applied to the groove 10.

As illustrated in FIG. 2B, when the cover 1 and the base 4 are joined together, the sealing material 20 is pushed to flow into a space 16 formed by a difference between the width W2 of the groove 10 and the width W1 of the projection 12 of the cover 1. The space 16 is a clearance formed in an area in which the cover 1 and the base 4 are to be joined together when the projection 12 is inserted into the groove 10.

Therefore, through the space 16 formed in the area in which the cover 1 and the base 4 are to be joined together, an application state of the sealing material 20 can be checked with the naked eye in a state in which the cover 1 and the base 4 are joined together.

In this example, the space 16 enabling the application state of the sealing material 20 to be checked with the naked eye from the exterior is provided so as to extend horizontally in parallel to the base 4.

Therefore, the application state of the sealing material 20 can be easily checked in a comfortable posture without moving the casing. Accordingly, high workability during the checking is provided.

Further, the projection 12 of the cover 1 is lowered while the inner wall surface 39 thereof is held in surface contact with the inner wall surface 34 of the groove 10. Therefore, the sealing material 20 does not flow into the interior of the casing and stays in the space 16 enabling the application state of the sealing material 20 to be checked from the exterior. Accordingly, a portion with an insufficient amount of the sealing material 20 can be easily identified.

The space 16 formed in the area in which the base 4 and the cover 1 are to be joined together has an opening width for additionally applying the sealing material 20 from the exterior and functions as a space for storing the sealing material 20 therein. Therefore, when the application amount of the sealing material 20 is small, additional application of the sealing material 20 can be easily performed through the space 16.

The opening width of the space 16 is larger than a diameter of a nozzle 50 of sealing-material injection means for additionally applying the sealing material 20 from the exterior. The additional application of the sealing material 20 is performed while the nozzle 50 is oriented toward the groove 10 through the space 16.

Figure 2C:
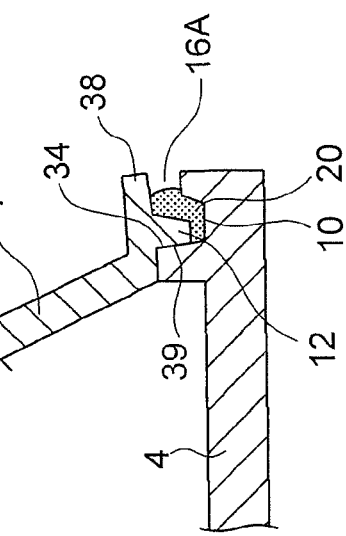
FIG. 2C is a sectional view of the principal part of the cover and the base, illustrating a variation of an area in which the cover and the base are to be joined together.

FIG. 2C is a sectional view illustrating an example where a space 16A for checking the application state of the sealing material 20 is provided so as to extend vertically.

In this example, a protruding portion 38 which extends horizontally is formed on the lower end of the cover 1. The space 16A is formed between the protruding portion 38 and the base 4.

When the space 16A is provided vertically with respect to the base 4, as compared with the case where the space 16 is provided horizontally, a space for storing the sealing material 20 is secured in the vertical direction, although it is necessary to move the casing to check the surfaces at which the cover 1 and the base 4 are joined together in order to check the application state of the sealing material 20. Therefore, the outer dimension of the casing can be designed smaller. Accordingly, the example with the space 16A is advantageous in terms of reduction in size.

Note that, a color of the sealing material 20 may be set different from that of the cover 1, the base 4, and the lid 30, serving as the casing members constituting the casing, so that the application state of the sealing material 20 is more easily checked.

Further, a colorless and transparent material may be used for the cover 1 so that the application state of the sealing material 20 is more easily checked in the areas in which the cover 1 and each of the base 4 and the lid 30 are to be joined together.

In this case, the space in the areas in which the cover 1 and each of the base 4 and the lid 30 are to be joined together may be omitted.

Figure 3:
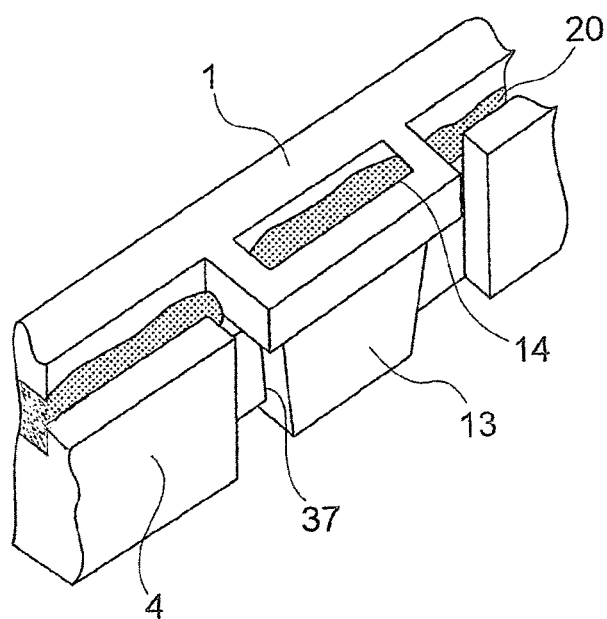
FIG. 3 is a perspective view of one of claws illustrated in FIG. 1.

FIG. 3 is a perspective view illustrating one of claws 13 provided to the cover 1.

The claws 13 are formed on the lower edge of the cover 1 at three positions.

A hole 14 is formed at a base of each of the claws 13. A locking portion 37 is formed on the base 4 so as to correspond to the claw 13. The claw 13 is elastically locked to the locking portion 37. In this manner, the cover 1, the base 4, and the lid 30 are prevented from being moved relative to each other until the sealing material 20 is cured.

The hole 14 formed at the base is formed simultaneously with formation of the claw 13. Through the hole 14, the application state of the sealing material 20 can be checked, as in the case of the surfaces of the cover 1 and the base 4 at which the cover 1 and the base 4 are to be joined together except for the claws 13.

The hole 14 has an opening width for additional application of the sealing material 20 and is also used as a space for storing the sealing material 20 for the additional application as in the case of the space 16 formed in the area in which the cover 1 and the base 4 are to be joined together except for the claws 13.

Note that, a height of the sealing material 20 in the hole 14 may be used as a criterion for determining the application amount of the sealing material 20.

Therefore, even in portions with the claw 13, the application state of the sealing material 20 can be checked. Thus, the same effect as that of portions without the claws 13 can be obtained.

Moreover, the hole 14 provided at the base of the claw 13 has the opening width enabling the additional application of the sealing material 20. Therefore, workability during additional application of the sealing material 20 is improved.

Note that, the area in which the cover 1 and the lid 30 are to be joined together has the same structure as that of the area in which the cover 1 and the base 4 are to be joined together. Thus, the structure provides such effects as enabling the application state of the sealing material 20 to be checked with the naked eye, through the space formed in the area in which the cover 1 and the lid 30 are to be joined, in the state in which the cover 1 and the lid 30 are joined together.

Embodiment 2

Figure 4A:
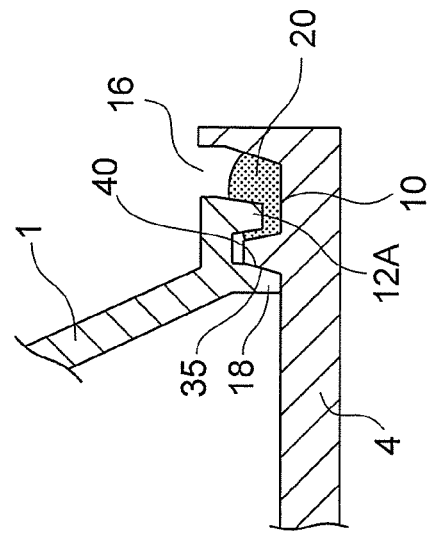
FIG. 4A is a sectional view of a principal part of a cover and a base of an electronic controller according to Embodiment 2 of the present invention before the cover and the base are joined together.
Figure 4B:
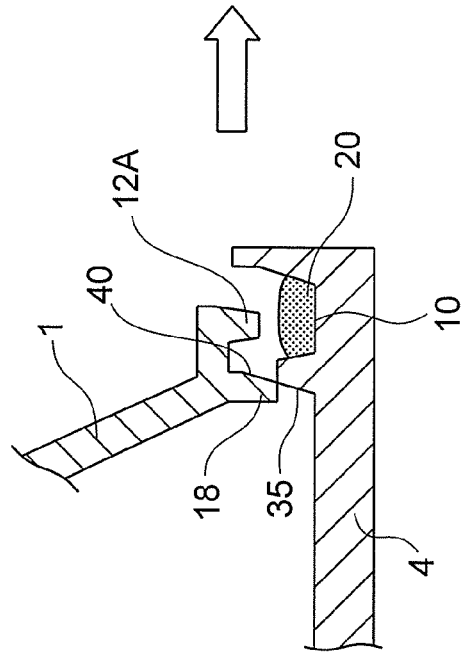
FIG. 4B is a sectional view of the principal part of the cover and the base after the cover and the base are joined together.

FIG. 4A is a sectional view of a principal part of the cover 1 and the base 4 of an electronic controller according to Embodiment 2 of the present invention before the cover 1 and the base 4 are joined together, whereas FIG. 4B is a sectional view of the principal part of the cover 1 and the base 4 after the cover 1 and the base 4 are joined together.

In this embodiment, a jetty 18 is provided to the cover 1 so as to be formed on an inner side of a projection 12A and be opposed to the projection 12A. A dimension of the jetty 18 toward the base 4 is longer than a dimension of the projection 12A toward the base 4.

The remaining configuration is the same as that of the electronic controller of Embodiment 1.

In this embodiment, before the projection 12A of the cover 1 presses and flattens the sealing material 20, an inner wall surface 40 of the jetty 18 comes into contact with an inner wall surface 35 of the base 4, and then the jetty 18 is lowered while blocking an inflow path of the sealing material 20 into the interior of the casing. Therefore, the sealing material 20 is prevented from entering the interior of the casing.

Whereas two surfaces of the projection 12 are covered with the sealing material 20 in Embodiment 1 as illustrated in FIG. 2B, all the surfaces of the projection 12A are covered with the sealing material 20 in this Embodiment 2. Therefore, a length over which the projection 12A is in contact with the sealing material 20 becomes correspondingly long as compared with that in Embodiment 1. Accordingly, higher adhesion strength and sealability between the cover 1 and the base 4 are provided.

The remaining functions and effects are the same as those of the electronic controller according to Embodiment 1.

Note that, the area in which the cover 1 and the lid 30 are to be joined together has the same structure as that of the area in which the cover 1 and the base 4 are to be joined together. Thus, the structure provides such effects as enabling the application state of the sealing material 20 to be checked with the naked eye, through the space formed in the area in which the cover 1 and the lid 30 are to be joined together, in the state in which the cover 1 and the lid 30 are joined together.

Embodiment 3

Figure 5:
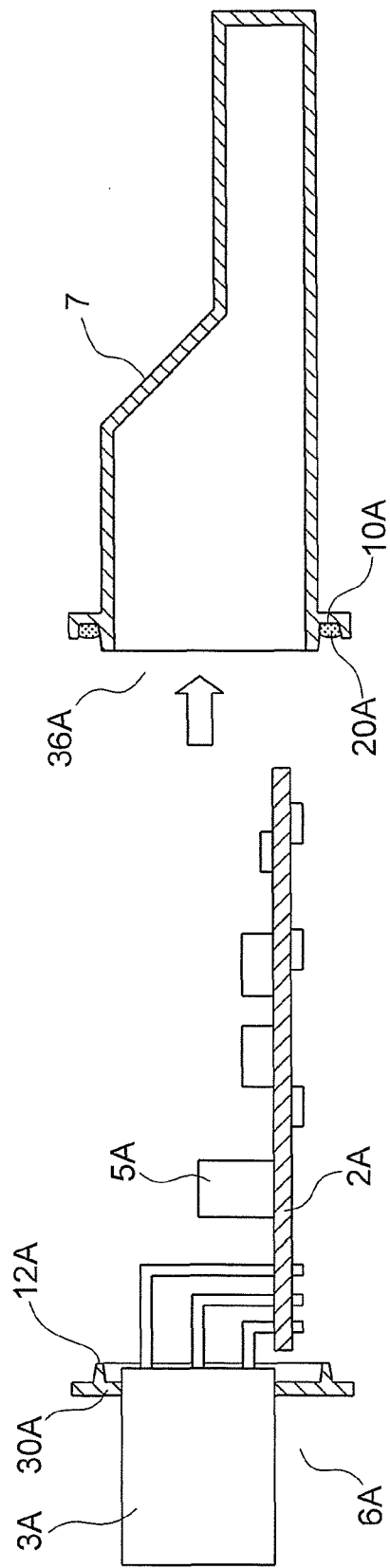
FIG. 5 is an exploded sectional view schematically illustrating a structure of an electronic controller according to Embodiment 3 of the present invention.

FIG. 5 is an exploded sectional view schematically illustrating a structure of an electronic controller according to Embodiment 3 of the present invention. FIG. 6A is a sectional view of a principal part of a casing main body 7 and a lid 30A illustrated in FIG. 5 before the casing main body 7 and the lid 30A are joined together, whereas FIG. 6B is a sectional view of the principal part of the casing main body 7 and the lid 30A after the casing main body 7 and the lid 30A are joined together.

The electronic controller according to Embodiment 3 includes the casing main body 7 and the lid 30A. The casing main body 7 is a casing member which houses an electronic circuit board 2A therein. The lid 30A is a casing member which supports connectors 3A electrically connected to the electronic circuit board 2A and closes an opening portion 36A of the casing main body 7.

Note that, the lid 30 and the connectors 3A may be formed as one component instead of being formed as separate members.

A groove 10A is formed on the casing main body 7 so as to surround the entire periphery of the opening portion 36A. The projection 12A is formed on the lid 30A so as to be opposed to the groove 10A, which is to be applied with a sealing material 20A.

In this embodiment, when the lid 30A and the casing main body 7 are to be joined together, an inner wall surface 39A of the projection 12A is lowered while being held in surface contact with an outer peripheral end surface 42 of the casing main body 7. In this manner, the projection 12A presses and flattens the sealing material 20A applied to the groove 10A.

As illustrated in FIG. 6B, a space 16B is provided in an area in which the lid 30A and the casing main body 7 are to be joined together. The sealing material 20A is pressed to flow into the space 16B. Through the space 16B, an application state of the sealing material 20A can be checked when the lid 30A and the casing main body 7 are joined together.

The space 16B for checking the state of the application of the sealing material 20A to the groove 10A of the casing main body 7 has an opening width for additionally applying the sealing material 20A from the exterior, and functions as a space for storing the sealing material 20A therein. Therefore, when the application amount of the sealing material 20A is small, additional application of the sealing material 20A can be easily performed through the space 16B.

The opening width of the space 16B is larger than the diameter of the nozzle 50 of the sealing-material injection means for additionally applying the sealing material from the exterior.

Note that, the groove 10 is formed on the base 4 and the projection 12 is formed on the cover 1 in Embodiments 1 and 2 described above, but the groove may be formed on the cover and the projection may be formed on the base.

Further, the groove 10A is formed on the casing main body 7 and the projection 12A is formed on the lid 30A in Embodiment 3 described above, but the groove may be formed on the lid and the projection may be formed on the casing main body.

Still further, the three casing members are used to constitute the casing in Embodiments 1 and 2, and the two casing members are used to constitute the casing in Embodiment 3. However, it is apparent that four or more casing members may be used to constitute the casing.

What is claimed is:

1. An electronic controller, comprising:
an electronic circuit board having electronic components mounted thereon; and
a casing for housing the electronic circuit board therein, the casing comprising a plurality of casing members sealed with a sealing material applied to surfaces at which the plurality of casing members are to be joined together, the plurality of casing members comprise a base and a cover which interpose the electronic circuit board from both sides thereof so as to cover the electronic circuit board;
wherein an area in which the plurality of casing members are to be joined together is provided with a space thereto for enabling an application state of the sealing material to be observed with a naked eye from exterior in a state in which the plurality of casing members are joined together,
grooves to be applied with the sealing material are formed on any one of the base and the cover,
a projection oriented toward the groove is formed on another one of the base and the cover, a width of the projection is less than a width of the groove, and
the space comprises a clearance generated in the area in which the plurality of casing members are to be joined together when the projection is inserted into the grooves, so that a wall surface of the projection comes into surface contact with a wall surface of the groove.

2. The electronic controller according to claim 1, wherein the space has an opening width larger than a diameter of a nozzle of sealing-material injection means for additionally applying the sealing material from the exterior.

3. The electronic controller according to claim 1, wherein the space is provided so as to extend in a horizontal direction.

4. The electronic controller according to claim 1, wherein the space is provided so as to extend in a vertical direction.

5. The electronic controller according to claim 1, wherein a jetty for preventing the sealing material from entering interior of the casing when a pair of the plurality of casing members are joined together is provided on an inner side of the area in which the plurality of casing members are to be joined together.

6. The electronic controller according to claim 1, wherein a color of the sealing material is different from that of the casing.

7. The electronic controller according to claim 1, wherein:
the plurality of casing members comprise a casing main body which houses the electronic circuit board therein, and a lid for supporting connectors electrically connected to the electronic circuit board and closing an opening portion of the casing main body;
a groove to be applied with the sealing material is formed on any one of the casing main body and the lid;
a projection oriented toward the groove is formed on another one of the casing main body and the lid; and
the space comprises a clearance formed in the area in which the plurality of casing members are to be joined together when the projection is inserted into the groove.

8. The electronic controller according to claim 1, wherein one of the grooves on the base or cover, extends continuously along portions where the casing members are joined together.

9. An electronic controller, comprising:
an electronic circuit board having electronic components mounted thereon; and
a casing for housing the electronic circuit board therein, the casing comprising a plurality of casing members sealed with a sealing material applied to surfaces at which the plurality of casing members are to be joined together,
wherein an area in which the plurality of casing members are to be joined together is provided with a space thereto for enabling an application state of the sealing material to be observed with a naked eye from exterior in a state in which the plurality of casing members are joined together,
wherein, among a pair of the plurality of casing members joined together, a claw to be elastically locked to one of the pair of the plurality of casing members is provided to another one of the pair of the plurality of casing members, and a hole having the space for enabling the application state of the sealing material to be observed with the naked eye from the exterior is formed at a base of the claw.

10. An electronic controller, comprising:
an electronic circuit board having electronic components mounted thereon; and
a casing for housing the electronic circuit board therein, the casing comprising a plurality of casing members sealed with a sealing material applied to surfaces at which the plurality of casing members are to be joined together, the plurality of casing members comprise a base and a cover which interpose the electronic circuit board from both sides thereof so as to cover the electronic circuit board;

wherein an area in which the plurality of casing members are to be joined together is provided with a space thereto for enabling an application state of the sealing material to be observed with a naked eye from exterior in a state in which the plurality of casing members are joined together, grooves to be applied with the sealing material are formed on any one of the base and the cover, a projection oriented toward the groove is formed on another one of the base and the cover, and the space comprises a clearance generated in the area in which the plurality of casing members are to be joined together when the projection is inserted into the grooves, so that a wall surface of the projection comes into surface contact with a wall surface of the groove, wherein:

a lid groove to be applied with the sealing material is formed on the lid;

a second projection oriented toward the lid groove is formed on another one of the base and the cover; and another space comprises a clearance generated in the area in which the second projection is inserted into the lid groove.

\* \* \* \* \*